United States Patent
Hatano et al.

(10) Patent No.: US 8,555,497 B2
(45) Date of Patent: Oct. 15, 2013

(54) MANUFACTURING METHOD OF A WIRING SUBSTRATE

(75) Inventors: Kaoru Hatano, Atsugi (JP); Akihiro Chida, Atsugi (JP); Takaaki Nagata, Atsugi (JP); Masayuki Sakakura, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 497 days.

(21) Appl. No.: 12/485,957

(22) Filed: Jun. 17, 2009

(65) Prior Publication Data

US 2009/0314527 A1    Dec. 24, 2009

(30) Foreign Application Priority Data

Jun. 20, 2008  (JP) .................. 2008-161497

(51) Int. Cl.
*H01R 43/00* (2006.01)
(52) U.S. Cl.
USPC .................. 29/854; 29/830; 438/155
(58) Field of Classification Search
USPC ................ 29/825, 830, 854; 438/155
See application file for complete search history.

(56) References Cited

U.S. PATENT DOCUMENTS

| | | |
|---|---|---|
| 5,058,800 A | 10/1991 | Yoshizawa et al. |
| 5,075,166 A | 12/1991 | Sikorski et al. |
| 5,597,631 A | 1/1997 | Furumoto et al. |
| 5,770,313 A | 6/1998 | Furumoto et al. |
| 6,114,005 A | 9/2000 | Nagai et al. |
| 6,224,965 B1 | 5/2001 | Haas et al. |
| 6,403,221 B1 | 6/2002 | Nakamura et al. |
| 6,482,495 B1 | 11/2002 | Kohama et al. |
| 6,530,147 B1 | 3/2003 | Haas et al. |
| 6,780,493 B2 | 8/2004 | Noda et al. |
| 6,805,958 B2 | 10/2004 | Nakamura et al. |
| 7,049,178 B2 | 5/2006 | Kim et al. |
| 7,061,083 B1 | 6/2006 | Usami et al. |
| 7,224,046 B2 | 5/2007 | Abe et al. |

(Continued)

FOREIGN PATENT DOCUMENTS

| | | |
|---|---|---|
| CN | 1211160 | 3/1999 |
| CN | 1942049 | 4/2007 |

(Continued)

OTHER PUBLICATIONS

Chinese Office Action (Application No. 200910150549.8; CN11592) Dated Aug. 2, 2012.

*Primary Examiner* — Carl Arbes
(74) *Attorney, Agent, or Firm* — Eric J. Robinson; Robinson Intellectual Property Law Office, P.C.

(57) ABSTRACT

To form a conductive region in a prepreg without opening a through hole in a fibrous body. A wiring substrate is provided, including: an organic resin layer and a fibrous body, wherein the fibrous body is impregnated with the organic resin layer; and a wiring with which the fibrous body is impregnated and which is formed by dissolving the organic resin layer. The wiring is exposed on both surfaces of the organic resin layer and penetrates the fibrous body so that the fibrous body is positioned in the through wiring. Further, a semiconductor device is provided by adhering an integrated circuit chip having a bump to the wiring substrate so that the bump is in contact with the wiring.

13 Claims, 11 Drawing Sheets

(56) References Cited

U.S. PATENT DOCUMENTS

| | | |
|---|---|---|
| 7,485,489 B2 | 2/2009 | Björbell |
| 7,736,958 B2 * | 6/2010 | Dozen et al. .................. 438/155 |
| 7,737,368 B2 | 6/2010 | Kohara et al. |
| 7,785,933 B2 | 8/2010 | Dozen et al. |
| 7,906,847 B2 * | 3/2011 | Ohtani et al. .................. 257/729 |
| 7,968,427 B2 * | 6/2011 | Sugiyama et al. ............ 438/455 |
| 2002/0045394 A1 | 4/2002 | Noda et al. |
| 2004/0016118 A1 | 1/2004 | Haas et al. |
| 2005/0218503 A1 | 10/2005 | Abe et al. |
| 2005/0233122 A1 | 10/2005 | Nishimura et al. |
| 2006/0105153 A1 | 5/2006 | Jang et al. |
| 2007/0020932 A1 | 1/2007 | Maruyama et al. |
| 2007/0278563 A1 | 12/2007 | Takano et al. |
| 2008/0012126 A1 | 1/2008 | Dozen et al. |
| 2008/0083954 A1 | 4/2008 | Tokunaga |
| 2008/0224940 A1 | 9/2008 | Sugiyama et al. |
| 2008/0224941 A1 | 9/2008 | Sugiyama et al. |
| 2008/0242005 A1 | 10/2008 | Dozen et al. |
| 2008/0311706 A1 | 12/2008 | Dozen et al. |
| 2010/0171221 A1 | 7/2010 | Chida |

FOREIGN PATENT DOCUMENTS

| | | |
|---|---|---|
| EP | 1 092 739 | 4/2001 |
| EP | 1 589 797 | 10/2005 |
| JP | 05-190582 | 7/1993 |
| JP | 07-007246 | 1/1995 |
| JP | 10-092980 | 4/1998 |
| JP | 2002-232152 | 8/2002 |
| JP | 2004-078991 | 3/2004 |
| JP | 2004-362341 | 12/2004 |
| JP | 2007-091822 | 4/2007 |
| JP | 2008-112988 | 5/2008 |
| WO | 96/09158 | 3/1996 |
| WO | 01/01740 | 1/2001 |
| WO | 2004/001848 | 12/2003 |
| WO | 2008/041716 | 4/2008 |

* cited by examiner

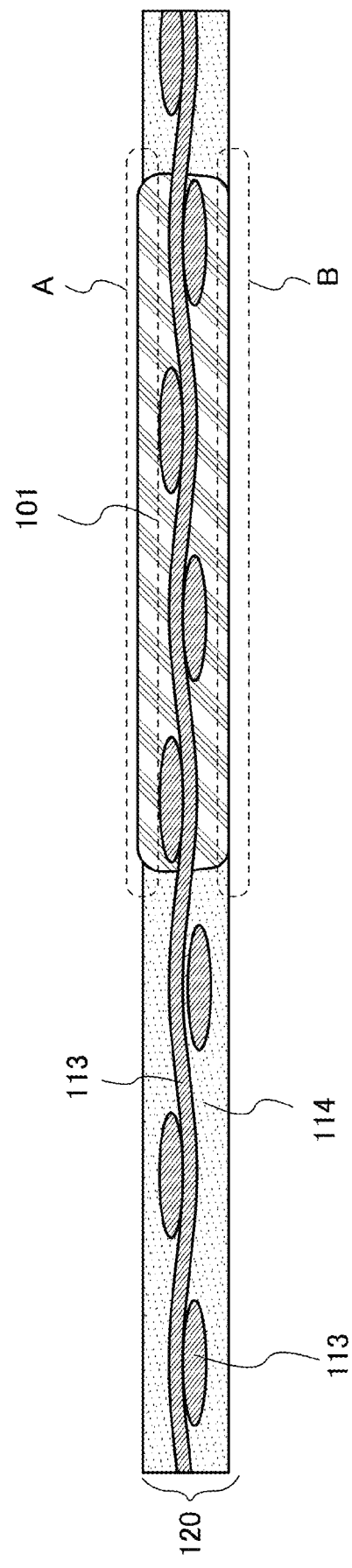

MANUFACTURING METHOD OF A WIRING SUBSTRATE

BACKGROUND OF THE INVENTION

1. Field of the Invention

The present invention relates to a wiring substrate which electrically and/or mechanically connects a semiconductor integrated circuit or a circuit substrate, and a semiconductor device using the wiring substrate.

2. Description of the Related Art

A prepreg in which a sheet-like fibrous body as a reinforcing material is impregnated with a thermosetting resin and the thermosetting resin is made in a semi-cured state has been used as a member of a circuit substrate and the like.

For example, a prepreg formed by opening a through hole in a predetermined position and filling the through hole with a conductive paste to become a conductor through an insulating layer by hot pressing is known in which a conductor passes and which is (see Patent Document 1: Japanese Published Patent Application No. 2007-091822). In this case, the through hole is opened in the prepreg by a laser, a drill, a punching machine, or the like.

Further, a prepreg used as a sealing material of a semiconductor device is disclosed (see Patent Document 2: Japanese Published Patent Application No. 2008-112988).

SUMMARY OF THE INVENTION

However, formation of a through hole in a composite substrate, such as a prepreg, in which a fibrous body is impregnated with a resin (hereinafter also referred to as a resin-impregnated fibrous-body composite substrate) damages a sheet-like fibrous body as a reinforcing material, whereby the strength of the resin-impregnated fibrous-body composite substrate is decreased. In the case of using the resin-impregnated fibrous-body composite substrate as a sealing body, if a through hole is opened in the sealing body for formation of a through wiring, airtightness cannot be maintained, and thus the resin-impregnated fibrous-body composite substrate cannot function as the sealing material. Further, since an opening has to be formed in both the sheet-like fibrous body and the resin layer, there is a problem in that the number of manufacturing steps is increased.

In view of the foregoing problems, it is an object of an embodiment of the invention disclosed in this specification to provide a conductive pattern which penetrates a resin-impregnated fibrous-body composite substrate while maintaining the strength of the sheet-like fibrous body. It is another object to use the resin-impregnated fibrous-body composite substrate provided with the penetrating conductive pattern as a sealing body of a semiconductor device.

One embodiment of the present invention is a wiring substrate having an organic resin layer which is provided on both surfaces of a sheet-like fibrous body and with which the sheet-like fibrous body is impregnated, and a through wiring with which the sheet-like fibrous body is impregnated and which is formed by dissolving a portion of the organic resin layer. The through wiring is exposed at upper and lower surfaces of the organic resin layer and penetrates the sheet-like fibrous body so that the sheet-like fibrous body is positioned in the through wiring. This through wiring is formed using a conductive resin, the conductive resin is exposed at upper and lower surfaces of the organic resin layer, the conductive resin penetrates a portion of the sheet-like fibrous body so that the sheet-like fibrous body is positioned in the conductive resin, and the sheet-like fibrous body is impregnated with the conductive resin. By impregnation of the sheet-like fibrous body with the conductive resin, electrical connection between the front and rear sides of the organic resin layer can be realized. In this case, since the sheet-like fibrous body remains in an entire region of the wiring substrate without any portion being removed, the sheet-like fibrous body serves as a reinforcing material.

Another embodiment of the present invention is a semiconductor device which includes a resin-impregnated fibrous-body composite substrate including an organic resin layer which is provided on both surfaces of a sheet-like fibrous body and with which the sheet-like fibrous body is impregnated, and a through wiring with which the sheet-like fibrous body is impregnated and which is formed by dissolving a portion of the organic resin layer. The through wiring is exposed at upper and lower surfaces of the organic resin layer and penetrates a portion of the sheet-like fibrous body so that the sheet-like fibrous body is positioned in the through wiring. An integrated circuit chip having a wiring (a bump) exposed on a surface of an insulating layer is fixed to the resin-impregnated fibrous-body composite substrate. The bump of the integrated circuit chip is in close contact with the through wiring of the resin-impregnated fibrous-body composite substrate. The through wiring is formed so that the sheet-like fibrous body is impregnated with a conductive resin. The sheet-like fibrous body remains in an entire region of the resin-impregnated fibrous-body composite substrate without any portion being removed; accordingly, the sheet-like fibrous body functions to maintain mechanical strength and airtightness.

Another embodiment of the present invention is a manufacturing method of a wiring substrate, including the steps of impregnating a sheet-like fibrous body with an organic resin layer; and forming a through wiring by provision of a conductive resin including a metal particle over a region of the organic resin layer, dissolution of the organic resin layer by the conductive resin, and penetration of the metal particle through the sheet-like fibrous body.

Still another embodiment of the present invention is a manufacturing method of a semiconductor device including the steps of: forming an integrated circuit chip having a bump exposed on a surface of an insulating layer; impregnating a sheet-like fibrous body with an organic resin layer; fixing the integrated circuit chip and the organic resin layer; and forming a through wiring which is in contact with the bump of the integrated circuit chip by provision of a conductive resin including a metal particle over a region of the organic resin layer, dissolution of the organic resin layer by the conductive resin, and penetration of the metal particle through the sheet-like fibrous body.

The sheet-like fibrous body includes a glass fiber.

Further, the metal particle includes any of copper (Cu), silver (Ag), nickel (Ni), gold (Au), platinum (Pt), palladium (Pd), tantalum (Ta), molybdenum (Mo), titanium (Ti), and tin (Sn).

According to one embodiment of the invention disclosed in this specification, even when a through wiring is provided in a wiring substrate which uses a resin-impregnated fibrous-body composite material, the wiring substrate is strong and can maintain mechanical strength.

According to one embodiment of the invention disclosed in this specification, in the case where the resin-impregnated fibrous-body composite substrate provided with a through wiring is used as a sealing body of a semiconductor device, mechanical strength and air tightness can be maintained.

BRIEF DESCRIPTION OF THE DRAWINGS

In the accompanying drawings:

FIG. 8 is a cross-sectional view illustrating the structures of FIGS. 7A and 7B;

DETAILED DESCRIPTION OF THE INVENTION

Figure 1A:
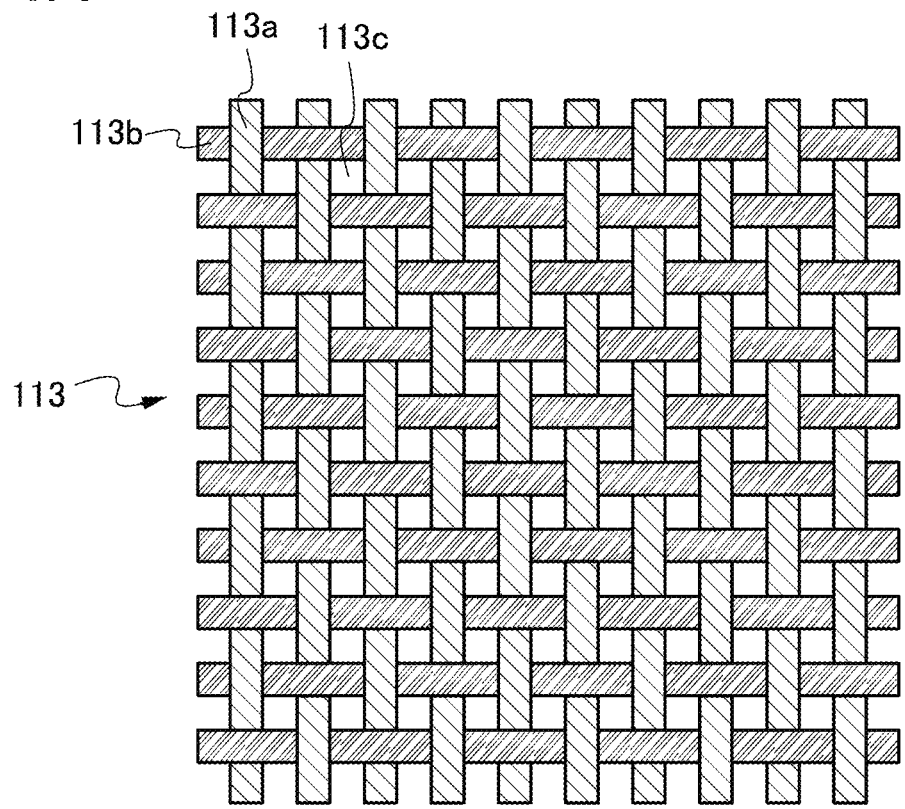
FIGS. 1A and 1B are top views of sheet-like fibrous bodies.

Hereinafter, embodiments of the present invention will be described with reference to the drawings. It is easily understood by those skilled in the art that modes and details herein disclosed can be modified in various ways without departing from the spirit and the scope of the present invention. Therefore, the present invention is not construed as being limited to description of the embodiments. Note that identical portions or portions having similar functions in the drawings are denoted by the same reference numerals and detailed descriptions thereof are omitted.

Note that in this specification, a semiconductor device refers to an element or a device in general which functions by utilizing a semiconductor. Electric devices including electric circuits, liquid crystal display devices, light-emitting devices, and the like and electronic devices on which the electric devices are mounted are included in the category of semiconductor devices.

Embodiment 1

In Embodiment 1, the structure of a wiring substrate and a manufacturing method thereof will be described with reference to FIGS. 1A and 1B and FIGS. 2A to 2C.

Figure 1B:
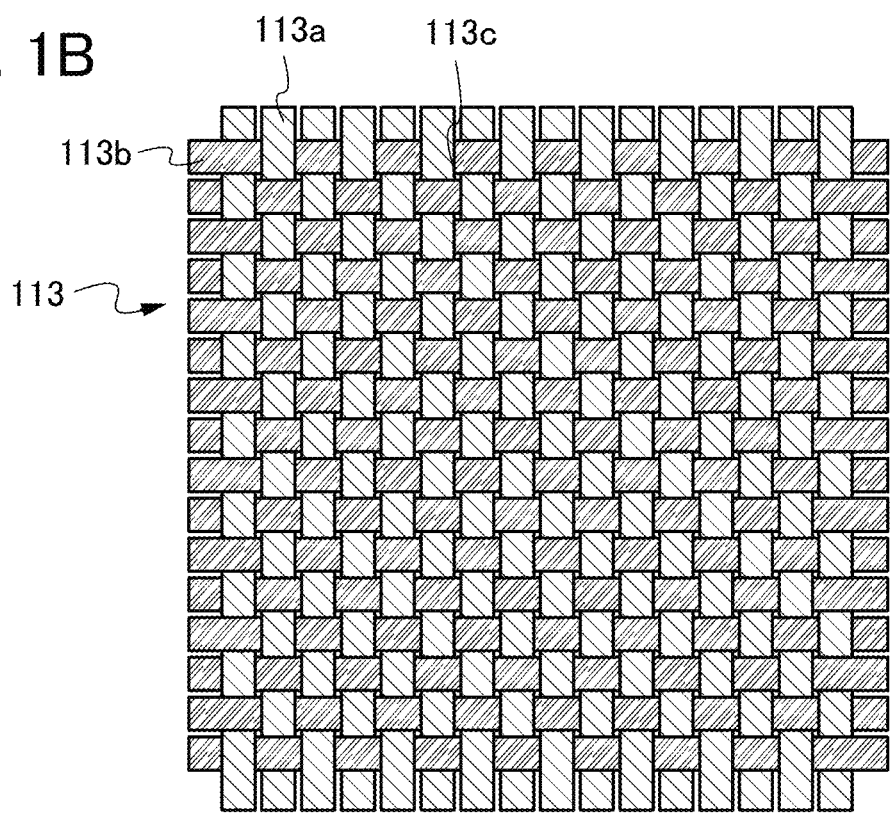
Figure 2A:
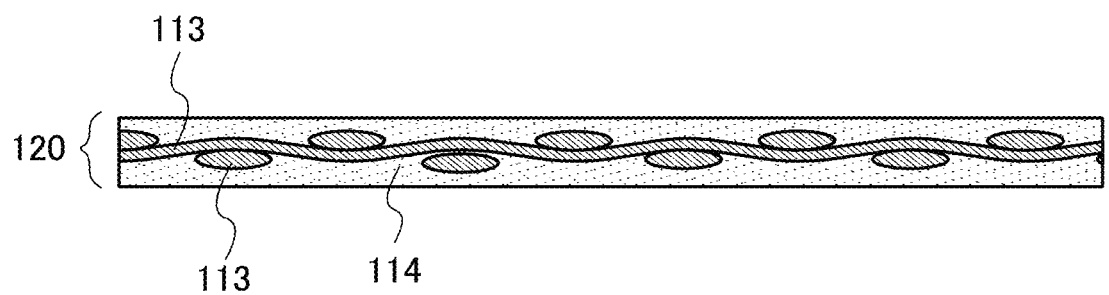
FIGS. 2A to 2C are cross-sectional views illustrating a manufacturing method of a wiring substrate.

FIGS. 1A and 1B are each a top view of a sheet-like fibrous body 113 which is a fabric woven using yarn bundles for warp yarns and weft yarns. FIG. 2A is a cross-sectional view of a structure body 120 in which the sheet-like fibrous body 113 is impregnated with an organic resin 114.

The sheet-like fibrous body 113 is a woven fabric or a nonwoven fabric of an organic compound or an inorganic compound. Further, as the sheet-like fibrous body 113, a high-strength fiber of an organic compound or an inorganic compound may be used.

The sheet-like fibrous body 113 may be formed using a woven fabric which is woven using bundles of fibers (single yarn) (hereinafter, referred to as yarn bundles) for warp yarns and weft yarns, or a nonwoven fabric obtained by stacking yarn bundles of plural kinds of fibers in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fiber opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Using a yarn bundle having an elliptical shape or a flat shape in cross section in this manner can reduce the thickness of the sheet-like fibrous body 113. Accordingly, the thickness of the structure body 120 can be made small, and a thin semiconductor device can be manufactured.

As illustrated in FIG. 1A, the sheet-like fibrous body 113 is woven using warp yarns 113a spaced at regular intervals and weft yarns 113b spaced at regular intervals. Such a sheet-like fibrous body has a region without the warp yarns 113a and the weft yarns 113b (in this specification, referred to as a "basket hole" 113c). In such a sheet-like fibrous body 113, the sheet-like fibrous body is further impregnated with the organic resin 114, whereby adhesiveness of the sheet-like fibrous body 113 can be further increased.

Alternatively, the density of the warp yarns 113a and the weft yarns 113b may be high and the proportion of the basket holes 113c may be low like the sheet-like fibrous body 113 illustrated in FIG. 1B. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. In the case where the basket hole 113c of the sheet-like fibrous body 113 has such a small area, even when pressure is applied by a member with a sharp tip (typically, a writing material such as a pen or a pencil), the pressure can be absorbed by the entire sheet-like fibrous body 113.

Further, in order to enhance permeability of the organic resin 114 into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

The high-strength fiber is specifically a fiber with a high tensile modulus of elasticity or a fiber with a high Young's modulus. As typical examples of the high-strength fiber, a polyvinyl alcohol fiber, a polyester fiber, a polyamide fiber, a polyethylene fiber, an aramid fiber, a polyparaphenylene benzobisoxazole fiber, a glass fiber, a carbon fiber, and the like can be given. As the glass fiber, a glass fiber using E glass, S glass, D glass, Q glass, or the like can be used. The sheet-like fibrous body 113 may be formed from one or more kinds of the above-described high-strength fibers.

As the organic resin 114 with which the sheet-like fibrous body 113 is impregnated, a thermosetting resin such as an epoxy resin, an unsaturated polyester resin, a polyimide resin, a bismaleimide-triazine resin, or a cyanate resin can be used, for example. Further, a thermoplastic resin such as a polyphenylene oxide resin, a polyetherimide resin, or a fluorine resin can be used. Furthermore, a plurality of the above-described thermosetting resins and thermoplastic resins may be used. When the above-described organic resin is used, the sheet-like fibrous body can be firmly fixed to an element layer by thermal treatment. Note that the higher the glass transition temperature of the organic resin 114 is, the less the organic resin 114 is damaged by local pressing force, which is preferable.

Highly thermally-conductive filler may be dispersed in the organic resin 114 or in the yarn bundles of fibers. As the highly thermally-conductive filler, an aluminum nitride, a bromine nitride, a silicon nitride, alumina, or the like can be given. As the highly thermally-conductive filler, a metal particle such as silver or copper can also be given. When the highly thermally-conductive filler is included in the organic resin or the yarn bundle, heat generated in the element layer can be easily released to the outside. Accordingly, thermal storage of the semiconductor device can be suppressed, and breakdown of the semiconductor device can be reduced.

Figure 2B:
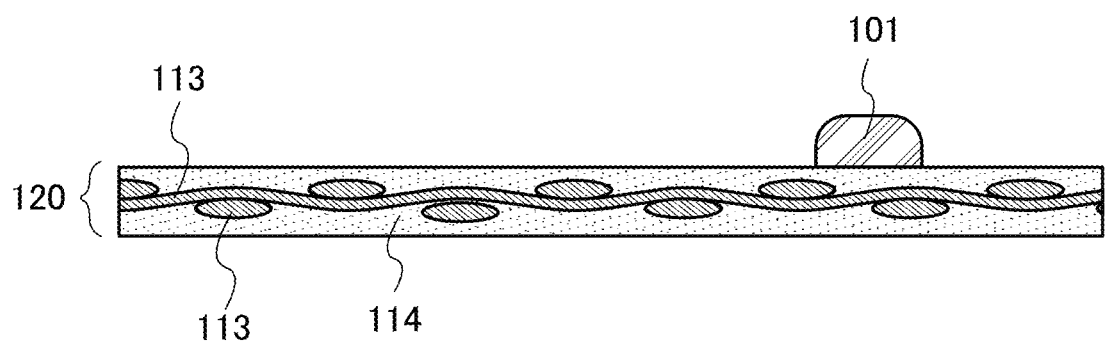
Figure 2C:
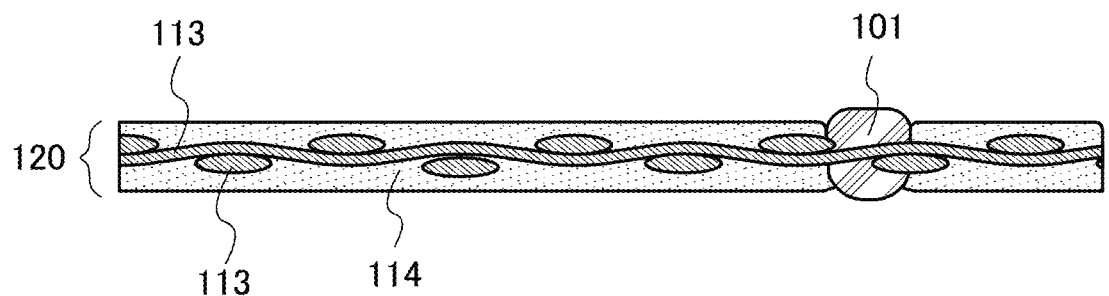

FIGS. 2B and 2C illustrate the structure body 120 in which electrical conduction is realized using a conductive resin 101 without a through-hole provided.

First, the conductive resin 101 is provided over the structure body 120 (see FIG. 2B). In this embodiment, a conductive paste including a metal element, for example, silver paste is used as the conductive resin 101. The metal element may be included in a conductive paste as a metal particle.

The conductive paste may be a paste including any of copper (Cu), silver (Ag), nickel (Ni), gold (Au), platinum (Pt), palladium (Pd), tantalum (Ta), molybdenum (Mo), titanium (Ti), and tin (Sn).

As the method of providing the conductive resin 101 over the structure body 120, a screen printing method or an ink-jet method may be employed.

When the conductive resin 101 is provided over the structure body 120, the organic resin 114 in the structure body 120 reacts with a component of the conductive resin 101 and, for example, in the case of using a conductive paste, the organic resin 114 reacts with the paste. Then, a portion of the organic resin 114 is dissolved and a metal particle in the conductive resin 101 passes through the sheet-like fibrous body 113 and moves to a surface (a second surface) opposite to a surface over which the conductive resin 101 is provided first (a first surface). Accordingly, a conductive region is formed in the structure body 120 (see FIG. 2C). Note that the area of the conductive resin 101 on the second surface of the structure body 120 may be larger or smaller than the area on the first surface. That is, the conductive resin 101 may constrict or expand when moving in the structure body 120.

One surface of the structure body 120 can be electrically connected to the other surface without formation of a through hole (also referred to as a contact hole) in the structure body 120, that is, without division of the sheet-like fibrous body 113; accordingly, the strength of the structure body 120 can be maintained.

Then, a heating step is performed so that an undissolved portion of the organic resin 114 in the structure body 120 is cured.

The thus-formed resin-impregnated fibrous-body composite substrate can maintain mechanical strength and airtightness while including a through wiring.

Embodiment 2

In Embodiment 2, a structure of a semiconductor device using a resin-impregnated fibrous-body composite substrate which is provided with a through wiring, and a manufacturing method thereof will be described with reference to FIGS. 3A to 3D, FIGS. 4A to 4E, FIGS. 5A to 5D, FIGS. 6A to 6E, and FIGS. 9A and 9B.

FIGS. 3A to 3D are cross-sectional views of element layers.

Figure 3A:
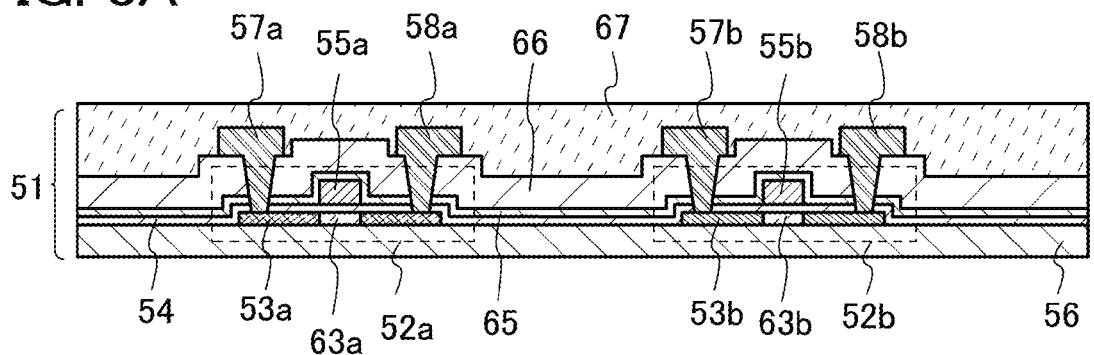
FIGS. 3A to 3D are cross-sectional views illustrating manufacturing methods of semiconductor devices.
Figure 3B:
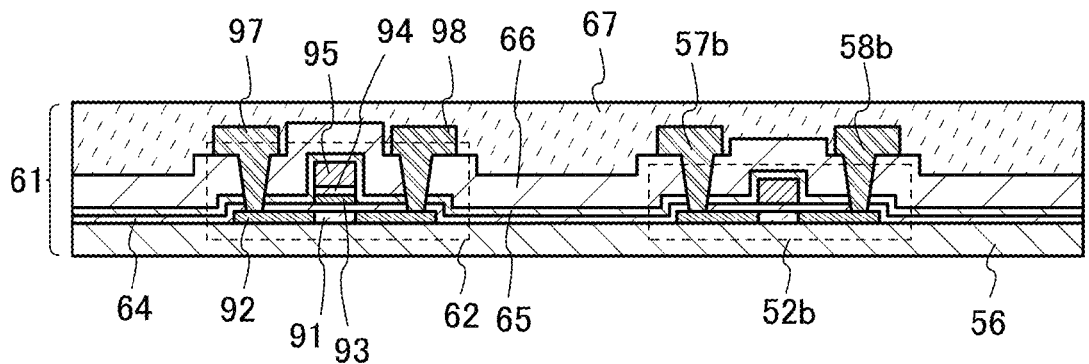
Figure 3C:
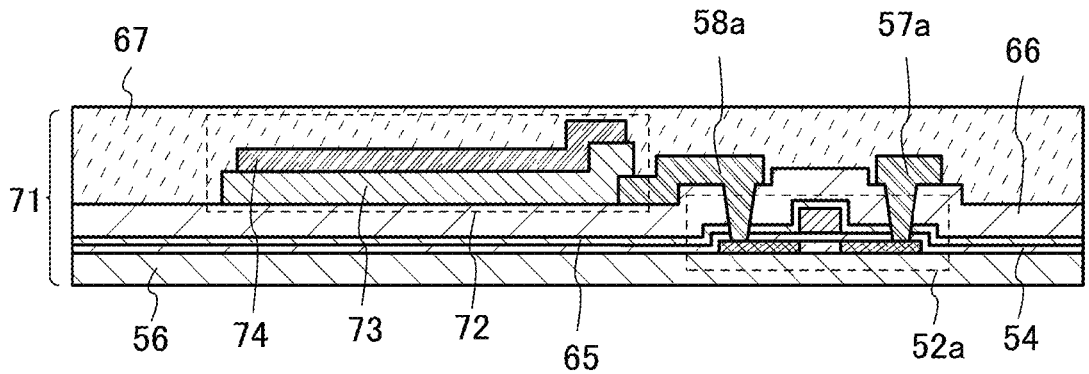
Figure 3D:
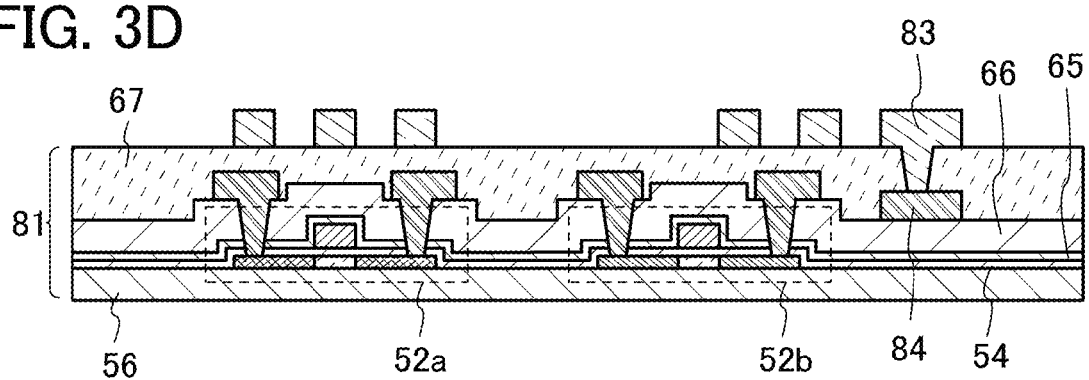

First, an element layer 51 illustrated in FIG. 3A has the same structure as those of FIGS. 4A to 4E, FIGS. 5A to 5D, FIGS. 6A to 6E, and FIGS. 9A and 9B. In FIGS. 3B to 3D, the same components as those in FIG. 3A are denoted by the same reference numerals.

The element layer 51 includes a thin film transistor 52a, a thin film transistor 52b, an insulating film 65, an insulating film 66, and an insulating film 67 over an insulating layer 56. The thin film transistor 52a includes a semiconductor layer including impurity regions 53a which are a source region and a drain region and a channel formation region 63a, a gate insulating layer 54, and a gate electrode 55a. The thin film transistor 52b includes a semiconductor layer including impurity regions 53b which are a source region and a drain region and a channel formation region 63b, the gate insulating layer 54, and a gate electrode 55b.

The impurity regions 53a of the thin film transistor 52a and the impurity regions 53b of the thin film transistor 52b each include an impurity element imparting one conductivity type. As an impurity element imparting n-type conductivity, phosphorus (P), arsenic (As), or the like may be used. As an impurity element imparting p-type conductivity, boron (B) or the like may be used. The impurity regions 53a and the impurity regions 53b may include different impurity elements imparting different conductivity types or the same impurity element imparting one conductivity type. In this embodiment, the impurity regions 53a include phosphorus (P) and are n-type impurity regions, and the impurity regions 53b include boron (B) and are p-type impurity regions. In other words, the thin film transistor 52a is an n-channel thin film transistor and the thin film transistor 52b is a p-channel thin film transistor.

In each of the thin film transistor 52a and the thin film transistor 52b, the semiconductor layer is a layer formed of non-single-crystal semiconductor having a thickness greater than or equal to 10 nm and less than or equal to 100 nm, and more preferably greater than or equal to 20 nm and less than or equal to 70 nm. As the non-single-crystal semiconductor layer, a crystalline semiconductor layer, an amorphous semiconductor layer, a microcrystalline semiconductor layer, or the like can be given. As the semiconductor, silicon, germanium, a silicon-germanium compound, or the like can be given. In particular, it is preferable to apply a crystalline semiconductor which is formed by crystallization through rapid thermal annealing (RTA) or thermal treatment using an annealing furnace, or a crystalline semiconductor which is formed by crystallization through heat treatment and laser beam irradiation. In the heat treatment, a crystallization method using a metal element such as nickel which can promote crystallization of silicon semiconductor can be used.

In the case of performing crystallization by laser beam irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 to 100 picoseconds inclusive, along the laser beam irradiation direction. By using such a crystallization method, a crystalline semiconductor having a large grain diameter with a crystal grain boundary extending in one direction can be obtained.

The gate insulating layer 54 is formed using an inorganic insulator such as a silicon oxide or a silicon oxynitride with a thickness greater than or equal to 5 nm and less than or equal to 50 nm, preferably greater than or equal to 10 nm and less than or equal to 40 nm.

The gate electrode 55a and the gate electrode 55b can be formed using metal, or a polycrystalline semiconductor to which an impurity element imparting one conductivity type is added. When using a metal, tungsten (W), molybdenum (Mo), titanium (Ti), tantalum (Ta), aluminum (Al), or the like can be used. Moreover, metal nitride obtained by nitriding metal can be used. Alternatively, a structure in which a first layer including the metal nitride and a second layer including the metal are stacked may be employed. At this time, by forming the first layer using metal nitride, the first layer can serve as a barrier metal. In other words, the metal of the second layer can be prevented from diffusing into the gate insulating layer or into the semiconductor layer that is provided in the lower than the gate insulating layer. In the case of employing a stacked structure, the gate electrode may have a shape in which the edge of the first layer extends beyond the edge of the second layer.

The thin film transistor 52a and the thin film transistor 52b which are formed by combination of the semiconductor layers, the gate insulating layer 54, the gate electrode 55a, the gate electrode 55b, and the like can have various structures such as a single drain structure, an LDD (lightly doped drain) structure, and a gate overlapped drain structure. Here, the thin film transistors have a single-drain structure. Alternatively, the thin film transistor can have a multi-gate structure which is equivalent to a plurality of transistors connected in series, to which the same gate voltage is applied, a dual gate structure where a semiconductor layer is interposed between gate electrodes, an inverted staggered structure where a gate electrode is formed over the insulating layer 56 and a gate insulating layer and a semiconductor layer are formed over the gate electrode, or the like.

Wirings 57a, 57b, 58a, and 58b which are in contact with the impurity regions 53a and the impurity regions 53b which are the source regions and the drain regions are preferably formed by combination of a low-resistance material such as aluminum (Al) and a barrier metal using a high-melting-point metal material such as titanium (Ti) or molybdenum (Mo), e.g., a stacked structure of titanium (Ti) and aluminum (Al) or a stacked structure of molybdenum (Mo) and aluminum (Al).

As the thin film transistor, a thin film transistor using a metal oxide or an organic semiconductor material for a semiconductor layer can be used. As typical examples of the metal oxide, a zinc oxide, an oxide of zinc gallium indium, and the like can be given.

A typical example of a semiconductor device including the element layer 51 is a microprocessor (MPU) which controls another device or performs calculation and processing of data. An MPU includes a CPU, a main memory, a controller, an interface, an I/O port, and the like, and each of them can be formed using a thin film transistor, a resistor, a capacitor, a wiring, or the like.

Further, as examples of the element layer 51, a driver device in a liquid crystal display device, a driver device in an EL display device, or a driver circuit in an electrophoresis device can be given. These can be structured using a thin film transistor, a resistor, a capacitor, a wiring, or the like.

A memory element 62 illustrated in FIG. 3B is a nonvolatile memory element including a semiconductor layer including a channel formation region 91 and impurity regions 92, a tunnel oxide layer 64, a floating gate 93, a control insulating layer 94, and a control gate 95.

The tunnel oxide layer 64 can be formed from a silicon oxide or formed to have a stacked structure of a silicon oxide and a silicon nitride, with a thickness of 1 nm to 10 nm, preferably 1 nm to 5 nm, by a low pressure CVD method, a plasma CVD method, or the like. Further, the tunnel oxide layer can be formed by oxidizing or nitriding a semiconductor layer by plasma treatment. Furthermore, a silicon oxide formed by a plasma CVD method may be oxidized or nitrided by plasma treatment. An insulating layer formed by the plasma treatment is dense, has high withstand voltage, and is excellent in reliability.

The floating gate 93 can be formed using a conductive layer, a polysilicon layer, a silicon dot, or the like. Instead of the floating gate, a charge storage layer formed from a silicon nitride, a germanium nitride, or the like may be used.

The control insulating layer 94 is formed of a single layer or a plurality of layers of a silicon oxide, a silicon nitride, a silicon oxynitride, an aluminum oxide, or the like by a low pressure CVD method, a plasma CVD method, or the like. The control insulating layer 94 is formed to have a thickness of 1 nm to 20 nm, preferably 5 nm to 10 nm.

The control gate 95 may be formed using a material similar to that of the gate electrode 55a or the gate electrode 55b illustrated in FIG. 3A.

As a driving element for driving the memory element 62, a thin film transistor 52b may be formed.

After the memory element 62 and the thin film transistor 52b are formed, an insulating film 65 and an insulating film 66 are formed to cover the memory element 62 and the thin film transistor 52b. A wiring 97 and a wiring 98 are formed over the insulating film 66 so as to be electrically connected to the impurity regions 92. For the thin film transistor 52b, a wiring 57b and a wiring 58b as described above are formed. An insulating film 67 is formed to cover the insulating film 66, the wiring 97, the wiring 98, the wiring 57b, and the wiring 58b. Thus, an element layer 61 including the memory element 62 is formed.

Examples of the memory element include, in addition to the structure of the memory element 62, a nonvolatile memory element including a charge accumulation layer; a thin film transistor and a capacitor which is connected to the thin film transistor; a thin film transistor and a capacitor which is connected to the thin film transistor and includes a ferroelectric layer; an organic memory element in which an organic compound layer is interposed between a pair of electrodes; and the like.

As semiconductor devices having such a memory element, memory devices such as DRAM (dynamic random access memory), SRAM (static random access memory), FeRAM (ferroelectric random access memory), mask ROM (read only memory), EPROM (electrically programmable read only memory), EEPROM (electrically erasable and programmable read only memory), and flash memory can be given.

A photodiode 72 illustrated in FIG. 3C includes a wiring 58a functioning as a first electrode, a light receiving portion 73, and a second electrode 74. The light receiving portion 73 can be formed using a semiconductor layer containing amorphous or crystalline silicon. As typical examples of the semiconductor layer, a silicon layer, a silicon germanium layer, a silicon carbide layer, and a PN junction layer and a PIN junction layer of these layers can be given.

A thin film transistor 52a is electrically connected to the photodiode 72 through the wiring 58a and functions as a driving element. An insulating film 65 and an insulating film 66 are formed over the thin film transistor 52a. A wiring 57a and a wiring 58a are formed over the insulating film 66 so as to be electrically connected to impurity regions of the thin film transistor 52a. Further, the light receiving portion 73 which is electrically connected to the wiring 58a is formed over the insulating film 66 and the second electrode 74 is formed over the light receiving portion 73.

An insulating film 67 is formed to cover the insulating film 66, the wiring 57a, the wiring 58a, the light receiving portion 73, and the second electrode 74. Thus, an element layer 71 including the photodiode 72 and the thin film transistor 52a is formed.

As semiconductor devices including the photodiode 72 illustrated in FIG. 3C, an optical sensor, a solar cell, and the like can be given.

An element layer 81 illustrated in FIG. 3D includes a thin film transistor 52a, a thin film transistor 52b, an electrode 84 which is formed over an insulating film 66 and electrically connected to the thin film transistor 52a or 52b, and an antenna 83 which is formed over an insulating film 67 and electrically connected to the electrode 84. The electrode 84 may be formed using a material and a manufacturing method similar to those of a wiring 57a, a wiring 58a, a wiring 57b, or a wiring 58b which is electrically connected to the thin film transistor 52a or the thin film transistor 52b.

The antenna 83 illustrated in FIG. 3D is formed in such a manner that a droplet or paste which includes metal particles of one or more of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. Formation of the antenna by a droplet discharge method enables the number of steps to be reduced, and cost can be reduced accordingly.

Further, the antenna 83 may be formed by a screen printing method. In the case of using a screen printing method, as a material for the antenna 83, a conductive paste where conductive particles having a particle size of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersible nanoparticles can be used. In addition, as the organic resin included in the conductive paste, one or a plurality of organic resins each functioning as a binder, a solvent, a dispersant, or a coating of the metal particle can be used. Typically, an organic resin such as an epoxy resin or a silicone resin can be used. Further, in forming the conductive layer, baking is preferably performed after the conductive paste is printed.

Alternatively, the antenna 83 may be formed using gravure printing or the like instead of a screen printing method or may be formed using a conductive material by a plating method, a sputtering method, or the like.

As typical examples of semiconductor devices including the element layer 81 illustrated in FIG. 3D, an ID tag, an IC tag, an RF (radio frequency) tag, a wireless tag, an electronic tag, an RFID (radio frequency identification) tag, an IC card, an ID card, and the like (hereinafter, referred to as an RFID), which can transmit and receive information wirelessly, can be given. Further, semiconductor devices of this embodiment include an inlet in which an integrated circuit portion including a thin film transistor and the like and an antenna are sealed; and the inlet formed into a sticker or card shape. Further, when the area of a top surface of the semiconductor device is greater than or equal to 4 mm$^2$, more preferably greater than or equal to 9 mm$^2$, the antenna can be formed to have a large area. Accordingly, an RFID with a long communication distance with a communication instrument can be obtained. Further, the connecting method disclosed in Embodiment 1 and this embodiment can be used for a connecting portion between an antenna and an integrated circuit portion of an RFID.

As a signal transmission method of an RFID, an electromagnetic coupling method or an electromagnetic induction method (e.g., 13.56 MHz band) is applied. In the case of utilizing electromagnetic induction caused by a change in magnetic flux density, the top view of the antenna can be a ring shape (e.g., a loop antenna) or a spiral shape (e.g., a spiral antenna).

Alternatively, a microwave method (e.g., a UHF band (860 to 960 MHz band), a 2.45 GHz band, or the like) can be employed as the signal transmission method of an RFID. In that case, the shape such as the length of the antenna may be appropriately determined in consideration of the wavelength of the electromagnetic wave used for the signal transmission.

Figure 9A:
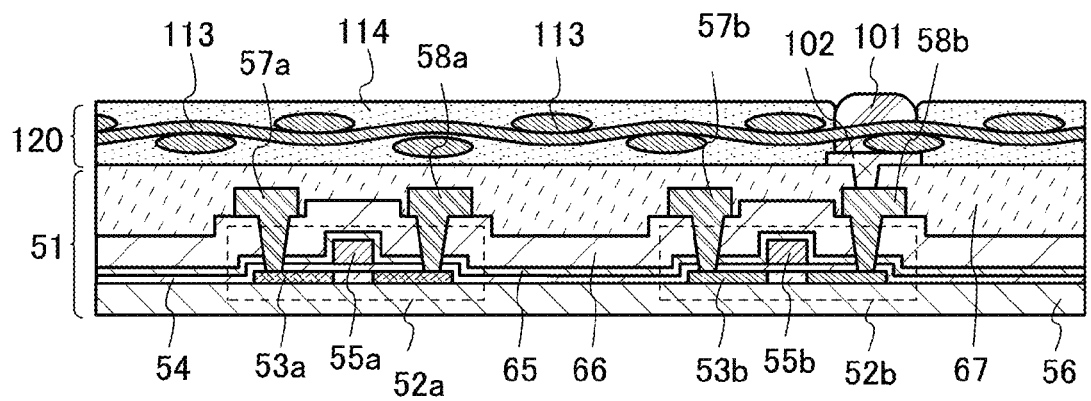
FIGS. 9A and 9B are cross-sectional views illustrating manufacturing methods of semiconductor devices.

FIG. 9A illustrates a structure in which a structure body 120 and a conductive resin 101 of this embodiment are applied to the element layer 51 including the thin film transistors 52a and 52b.

In FIG. 9A, the sheet-like fibrous body 113 is firmly fixed to one surface of the element layer 51 including the thin film transistors 52a and 52b with the organic resin 114. The structure body 120 is provided so as to cover the element layer 51.

Further, in addition to the one surface of the element layer 51, the sheet-like fibrous body 113 may be firmly fixed to the other surface of the element layer 51 with the organic resin 114. In other words, both surfaces of the element layer 51 may each be provided with a structure body so that the element layer 51 is covered with a pair of facing structure bodies on both surfaces.

Figure 9B:
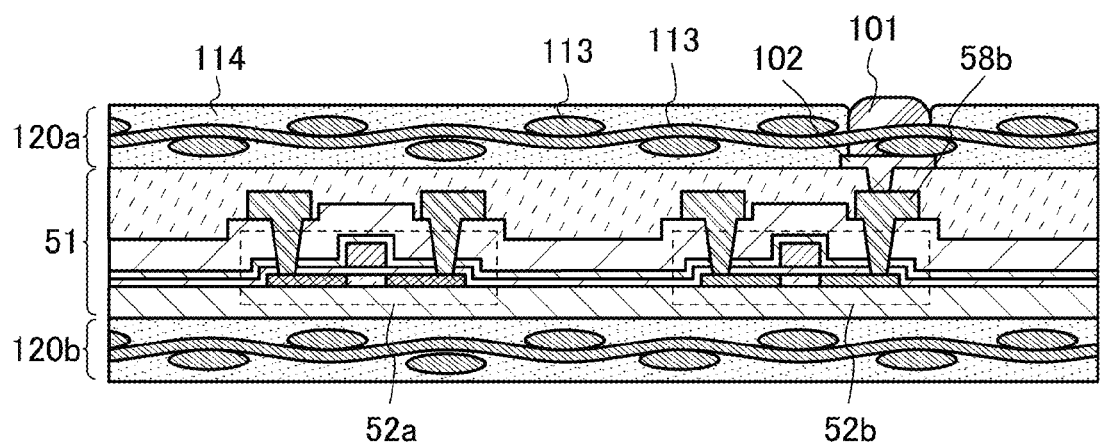

In the structure illustrated in FIG. 9B, one surface of the element layer 51 illustrated in FIG. 9A is provided with a structure body 120a and the other surface of the element layer 51 is provided with a structure body 120b. At this time, it is preferable that a sheet-like fibrous body and an organic resin of the structure body 120a have the properties same as those of the structure body 120b in order to reduce warpage. However, in the case of a use in which the front and the rear are distinguished from each other, it is not necessary that the structure bodies 120a and 120b are formed using materials having the same properties.

The organic resin with which the sheet-like fibrous body is impregnated is firmly fixed in such a manner, whereby both surfaces of the element layer are supported by the sheet-like fibrous bodies. Therefore, warpage of the entire semiconductor device can be reduced, which facilitates mounting of the semiconductor device including the element layer 51 on a laminate film, a sticker, or the like.

In the drawings of this specification, a sheet-like fibrous body 113 is illustrated as a woven which is plain-woven using a yarn bundle having an elliptical shape in cross section. Although the size of the thin film transistors 52a and 52b is larger than that of a yarn bundle of the sheet-like fibrous body 113, the size of the thin film transistors 52a and 52b may be smaller than that of a yarn bundle of the sheet-like fibrous body 113.

Next, a manufacturing method to obtain the structure illustrated in FIG. 9A will be described with reference to FIGS. 4A to 4E, FIGS. 5A to 5D, and FIGS. 6A to 6E.

Figure 4A:
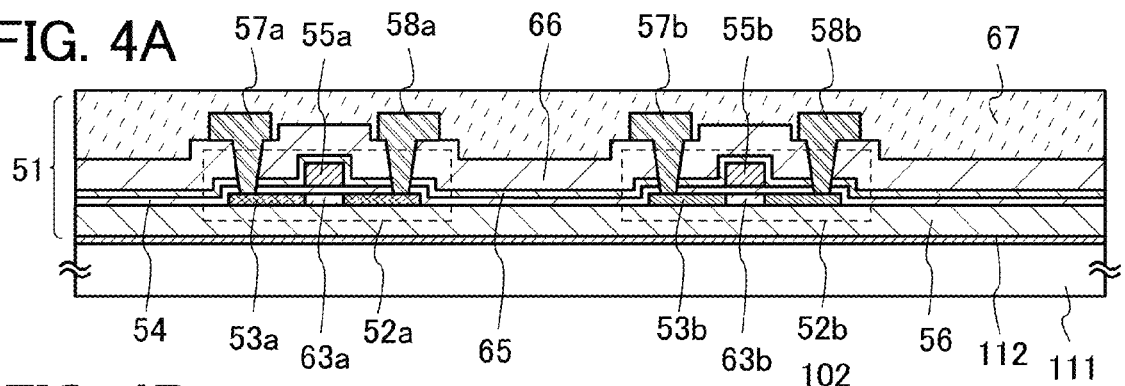
FIGS. 4A to 4E are cross-sectional views illustrating a manufacturing method of a semiconductor device.

As illustrated in FIG. 4A, a separation layer 112 is formed over a substrate 111 having an insulating surface. Then, the element layer 51 including the thin film transistor 52a and the thin film transistor 52b is formed over the separation layer 112.

As the substrate 111 having an insulating surface, a substrate which can withstand a temperature at which the element layer 51 is formed is preferably used. Typically, a glass substrate, a quartz substrate, a ceramic substrate, a metal substrate in which an insulating layer is formed over at least one surface, an organic resin substrate, or the like can be used. Here, a glass substrate is used as the substrate 111 having an insulating surface.

The separation layer 112 is formed in such a manner that a layer having a thickness of 30 nm to 200 nm and includes an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing any of the elements described above as its main component; or a compound containing any of the elements described above as its main component is formed by a sputtering method, a plasma CVD method, a coating method, a printing method, or the like to be a single layer or a laminate. The crystalline structure of a layer containing silicon may be any one of an amorphous structure, a microcrystalline structure, or a polycrystalline structure. Here, a coating method means a method by which a solution is discharged on an object to form a film, and includes a spin coating method and a droplet discharge method, for example. A droplet discharge method is a method of forming a predetermined pattern by discharging a droplet of a composition containing particulates from a small hole.

In the case where the separation layer 112 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds, for example, to an alloy of tungsten and molybdenum.

In the case where the separation layer 112 has a stacked structure, preferably, a metal layer is formed as a first layer, and a metal oxide layer is formed as a second layer. Typically, a layer containing tungsten, molybdenum, or a mixture of tungsten and molybdenum is formed as the first-layer metal layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

When the separation layer 112 has a stacked structure in which a metal layer is formed as the first layer and a metal oxide layer is formed as the second layer, the stacked structure may be formed by utilizing the following: a layer containing tungsten is formed as the metal layer, and an insulating layer formed of an oxide is formed thereover, whereby a layer containing an oxide of tungsten is formed as the metal oxide layer at the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizing power such as ozone water, or the like.

Examples of an oxide of tungsten include $WO_2$, $W_2O_5$, $W_4O_{11}$, $WO_3$, and the like.

Although the separation layer 112 is formed to be in contact with the substrate 111 having an insulating surface according to the above process, the present invention is not limited to this process. An insulating layer to be a base may be formed so as to be in contact with the substrate 111 having an insulating surface, and the separation layer 112 may be provided to be in contact with the insulating layer. Here, as the separation layer 112, a tungsten layer with a thickness of 30 nm to 70 nm is formed by a sputtering method.

An insulating layer 56 serving as a base layer is formed between the separation layer 112 and the thin film transistors 52a and 52b.

Figure 4B:
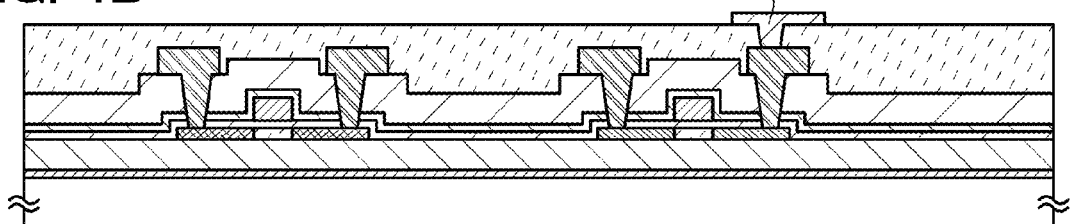

Next, the wiring 102 which is electrically connected to the wiring 58b is formed over the insulating film 67 (see FIG. 4B). The wiring 102 may be formed using a material similar to that of the wiring 58b. The wiring 102 is also referred to as a bump and has a function of electrically connecting the element layer 51 to the conductive resin 101 to be formed later.

Figure 4C:
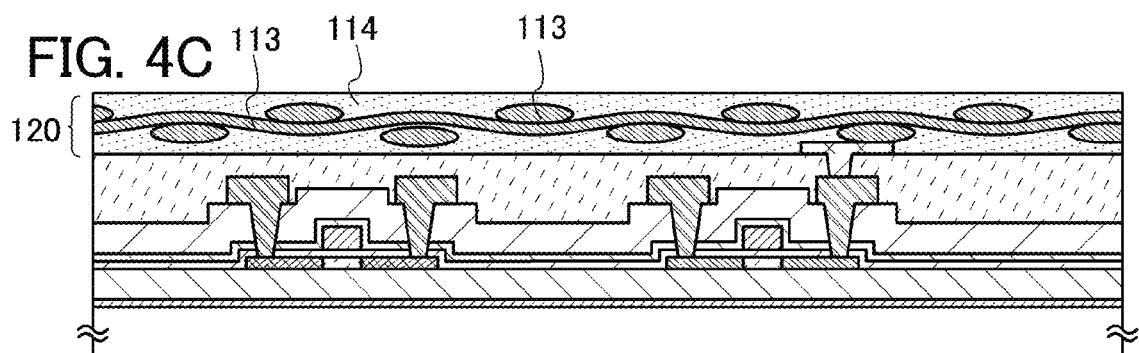

Next, the structure body 120 where the sheet-like fibrous body 113 is impregnated with the organic resin 114 is provided over the insulating film 67 and the wiring 102 (see FIG. 4C). Such a structure body 120 is also called a "prepreg". A prepreg is specifically formed in such a manner that, after a sheet-like fibrous body is impregnated with a compound in which a matrix resin is diluted with an organic solvent, drying is performed so that the organic solvent is volatilized and the matrix resin is semi-cured.

Next, the conductive resin 101 and the wiring 102 are electrically connected to each other by employing the manufacturing steps of FIGS. 2B and 2C.

Figure 4D:
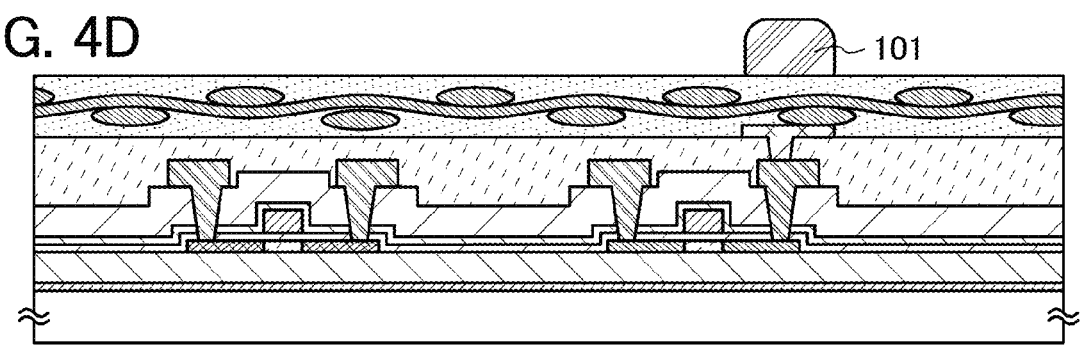

The conductive resin 101 is formed over the organic resin 114 in a region where the wiring 102 is formed (see FIG. 4D). In this embodiment, a conductive paste including a metal element, for example, silver paste is used as the conductive resin 101.

Figure 4E:
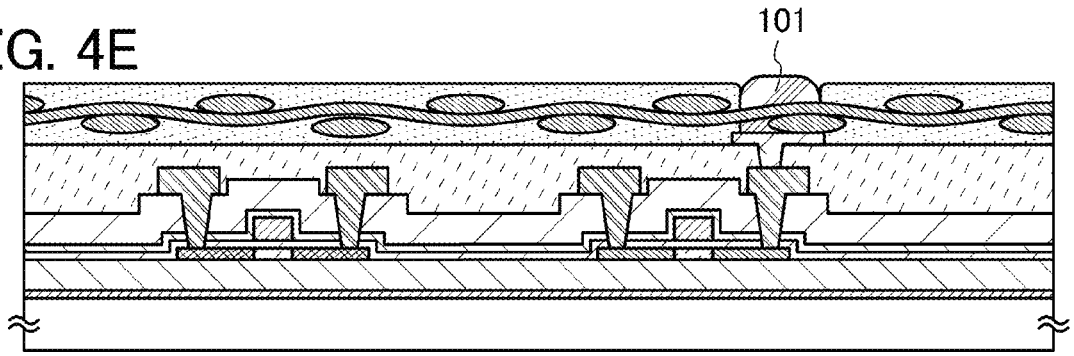

When the conductive resin 101 is formed over the structure body 120, the organic resin 114 in the structure body 120 is dissolved and the metal particle in the conductive resin 101 passes through the sheet-like fibrous body 113 in the region where the organic resin 114 is dissolved, whereby the conductive resin 101 is electrically connected to the wiring 102 (see FIG. 4E). Note that the conductive resin 101 may constrict or expand when moving in the structure body 120.

Next, the structure body 120 is heated and pressure-bonded so that an undissolved portion of the organic resin 114 in the structure body 120 is plasticized or cured. In the case where the organic resin 114 is an organic plastic resin, the organic resin 114 which is plasticized is then cured by cooling to room temperature.

The organic resin 114 uniformly spreads over surfaces of the insulating film 67 and the wiring 102 and is cured by heating and pressure bonding. Thus, the sheet-like fibrous body 113 is impregnated with the organic resin 114 and the structure body 120 is firmly fixed to one side of the insulating film 67 and one side of the wiring 102. A step of pressure-bonding the structure body 120 is performed under an atmospheric pressure or a reduced pressure.

Figure 5A:
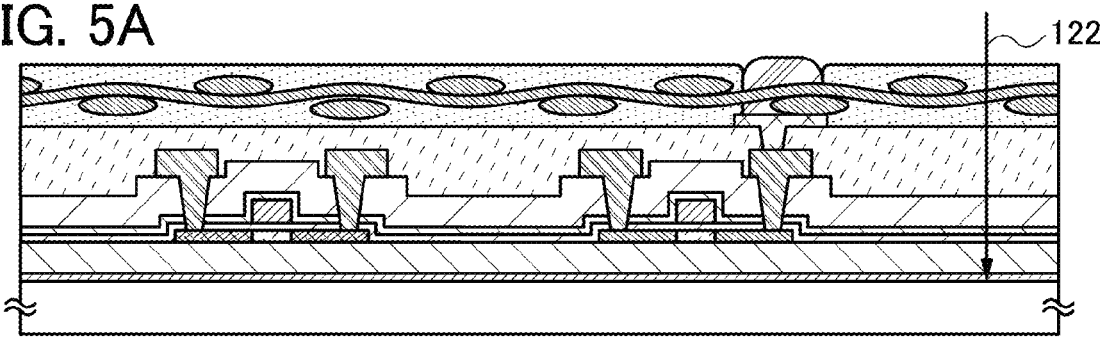
FIGS. 5A to 5D are cross-sectional views illustrating a manufacturing method of a semiconductor device.
Figure 5B:
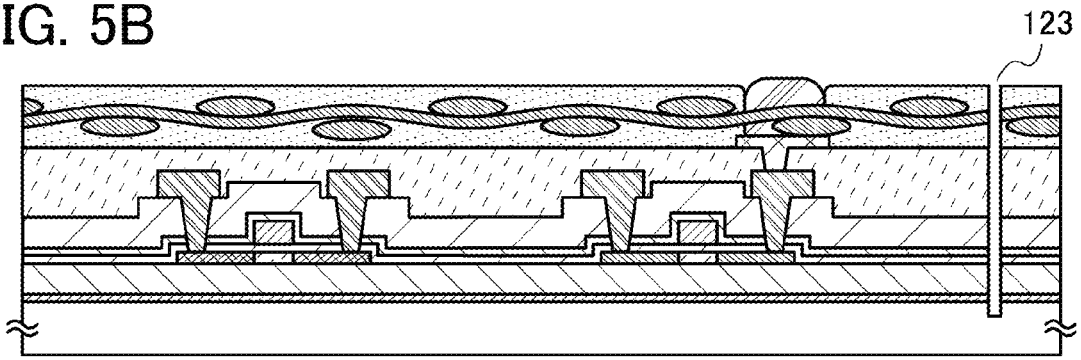

Next, in order to facilitate a subsequent separation step, a groove 123 as illustrated in FIG. 5B may be formed by irradiating the structure body 120, the element layer 51, and the separation layer 112 with a laser beam 122 from the side of the structure body 120 as illustrated in FIG. 5A. As the laser beam used for forming the groove 123, a laser beam with a wavelength which is absorbed by any of layers included in the separation layer 112, the element layer 51, or the structure body 120 is preferably used. Typically, a laser beam in the ultraviolet region, visible region, or infrared region is appropriately selected for irradiation.

As a laser capable of emitting such a laser beam, the following can be used: an excimer laser such as a KrF excimer laser, an ArF excimer laser, or a XeCl excimer laser; a gas laser such as a He laser, a He—Cd laser, an Ar laser, a He—Ne laser, an HF laser, or a $CO_2$ laser; a solid-state laser such as a crystal laser in which a crystal such as YAG, GdVO$_4$, YVO$_4$, YLF, or YAlO$_3$ is doped with Cr, Nd, Er, Ho, Ce, Co, Ti, or Tm, a glass laser, or a ruby laser; or a semiconductor laser such as a GaN laser, a GaAs laser, a GaAlAs laser, or an InGaAsP laser can be used. In the case of using a solid-state laser, any of the fundamental wave to the fifth harmonic wave is preferably used as appropriate.

Figure 5C:
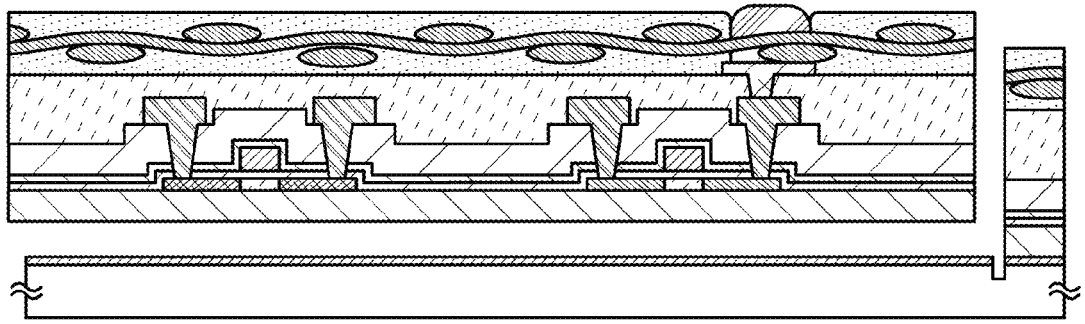
Figure 5D:
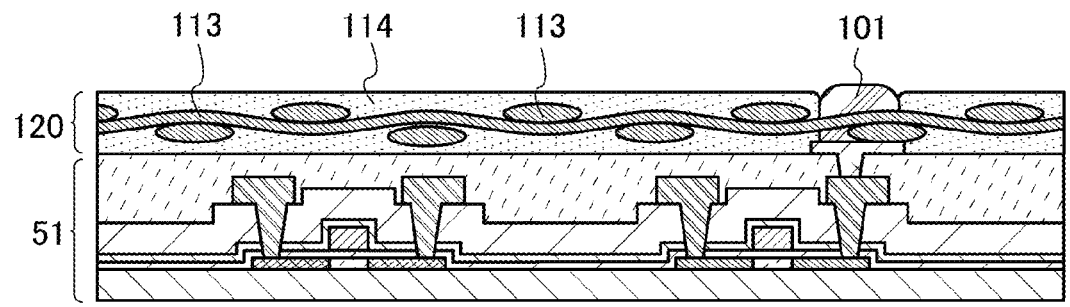

Next, as illustrated in FIG. 5C, by using the groove 123 as a trigger, the substrate 111 having an insulating surface over which the separation layer 112 is formed and part of the element layer 51 are separated from each other by physical means at the interface between the separation layer 112 and the insulating layer 56.

The physical means refers to dynamic means or mechanical means, which applies some dynamical energy (mechanical energy). Typically, the physical means is an action of applying mechanical force (e.g., a peeling process with human hands or with a gripper, or a separation process by rotating a roller). At this time, when an adhesive sheet which can be separated by light or heat is provided over a surface of the structure body 120, separation can be performed more easily.

Further, the element layer 51 may be separated from the separation layer 112 after a liquid is dropped into the groove 123 to allow the liquid to be infiltrated into the interface between the separation layer 112 and the insulating layer 56. In this case, a liquid may be dropped only into the groove 123, or the substrate 111 having an insulating surface, the element layer 51, and the structure body 120 may be wholly soaked in a liquid so that the liquid may be infiltrated from the groove 123 into the interface between the separation layer 112 and the element layer 51.

Alternatively, in FIG. 5B, a method can be employed in which a fluoride gas such as NF$_3$, BrF$_3$, or ClF$_3$ is introduced into the groove 123, and the separation layer is removed by etching with the use of the fluoride gas so that part of the element layer 51 is separated from the substrate 111 having an insulating surface.

In the above-described manner, a semiconductor device can be obtained in which the element layer 51 formed in contact with one surface of the structure body 120 is electrically connected to a terminal, a wiring, a circuit, another semiconductor element, or the like formed on the other surface of the structure body 120 without forming a through hole in the structure body 120.

In the case where a plurality of semiconductor devices are included in the element layer 51, the plurality of semiconductor devices may be obtained by dividing the element layer 51 and the structure body 120. With such a step, a plurality of semiconductor devices can be manufactured.

When the element layer 51 and the structure body 120 are divided to obtain a plurality of semiconductor devices, selective division is possible by dicing, scribing, using a cutting machine having an edged tool such as scissors or a knife, laser cutting, or the like.

A process in which after the structure illustrated in FIG. 4C is obtained, part of the element layer 51 is separated and then the conductive resin 101 is electrically connected to the wiring 102 will be described with reference to FIGS. 6A to 6E. Note that the process illustrated in FIGS. 6A to 6E and the process illustrated in FIGS. 4D and 4E and FIGS. 5A to 5D are different only in the order of steps; therefore, unless otherwise mentioned, the process illustrated in FIGS. 6A to 6E is based on the manufacturing steps of FIGS. 4D and 4E and FIGS. 5A to 5D.

Figure 6A:
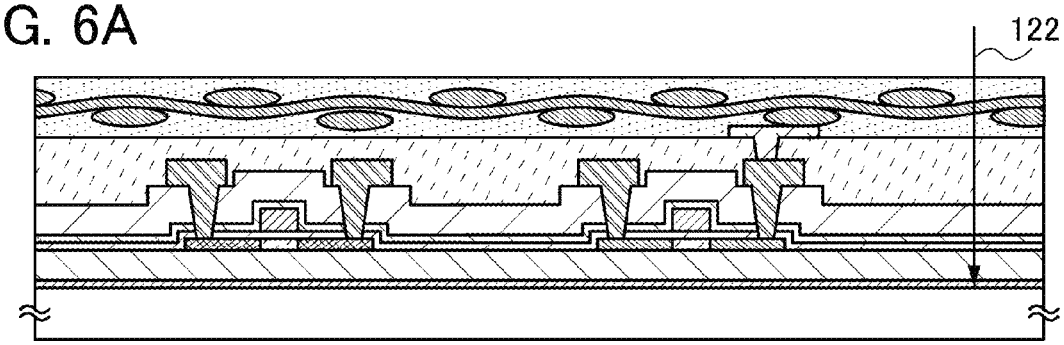
FIGS. 6A to 6E are cross-sectional views illustrating a manufacturing method of a semiconductor device.
Figure 6B:
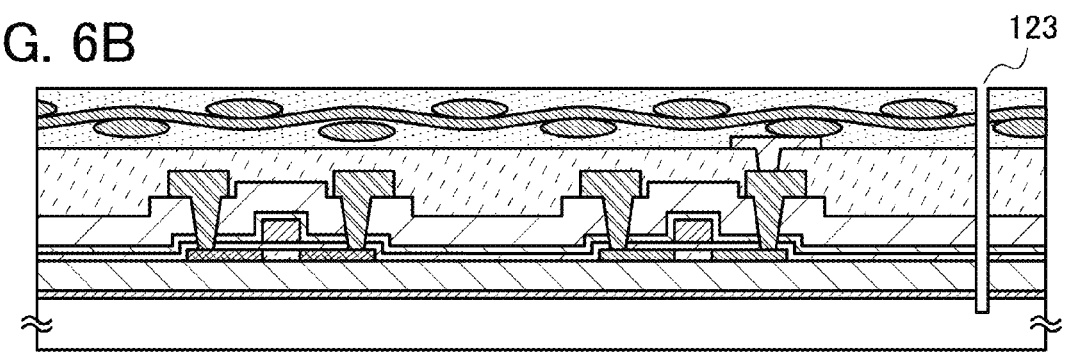
Figure 6C:
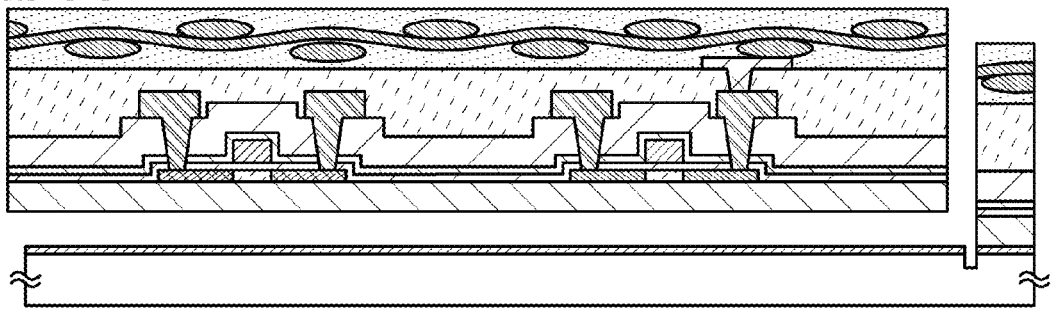
Figure 6D:
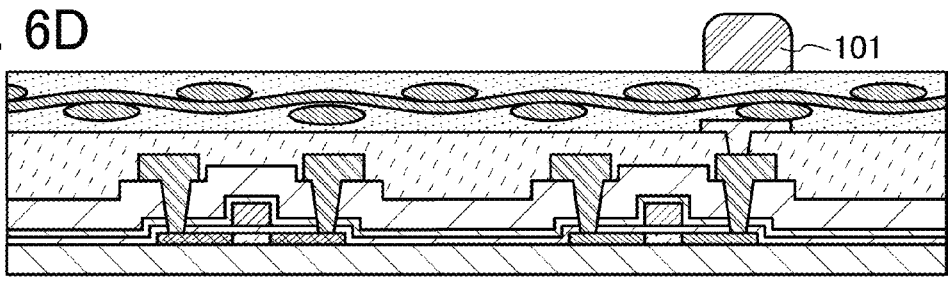

After the structure of FIG. 4C is obtained, irradiation with the laser beam 122 is carried out (see FIG. 6A) to form a groove 123 (see FIG. 6B). Then, by using the groove 123 as a trigger, the substrate 111 having an insulating surface over which the separation layer 112 is formed and part of the element layer 51 are separated from each other at the interface between the separation layer 112 and the insulating layer 56 (see FIG. 6C).

Figure 6E:
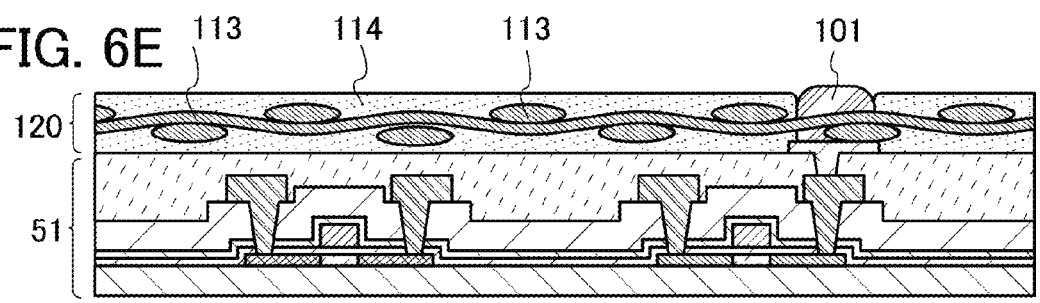

Next, the conductive resin 101 is formed over the structure body 120 in a region over the wiring 102 (see FIG. 6D), and a heating step is performed so that the conductive resin 101 passes through the sheet-like fibrous body 113 and is electrically connected to the wiring 102 (see FIG. 6E).

In the case where the resin-impregnated fibrous-body composite substrate provided with a through wiring as described above is used as a sealing body or a protective material of a semiconductor device, mechanical strength and airtightness can be maintained.

Embodiment 3

In Embodiment 3, examples in which Embodiment 1 and Embodiment 2 are applied to an external antenna of an RFID tag or connection with the external antenna will be described with reference to FIGS. 10A to 10C and FIGS. 11A to 11G.

Figure 10A:
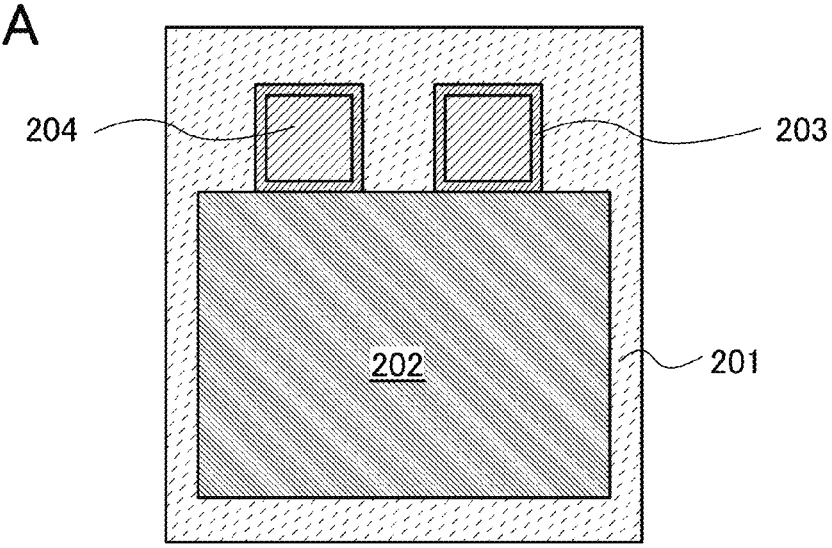
FIG. 10A is a top view of an RFID tag and FIGS. 10B and 10C are cross-sectional views of RFID tags.

First, FIG. 10A illustrates a chip of an RFID tag. The chip is formed over a substrate 201 from which the chip can be separated, and includes a semiconductor circuit portion 202, an electrode pad 203, and a conductive resin 204. The semiconductor circuit portion 202 may be formed using the structure illustrated in FIG. 3D in Embodiment 2 or the like. For the substrate 201, a flexible substrate or a glass substrate may be used. Any conductive resin that includes any of copper (Cu), silver (Ag), nickel (Ni), gold (Au), platinum (Pt), palladium (Pd), tantalum (Ta), molybdenum (Mo), titanium (Ti), and tin (Sn) may be used as the conductive resin 204.

Figure 10B:
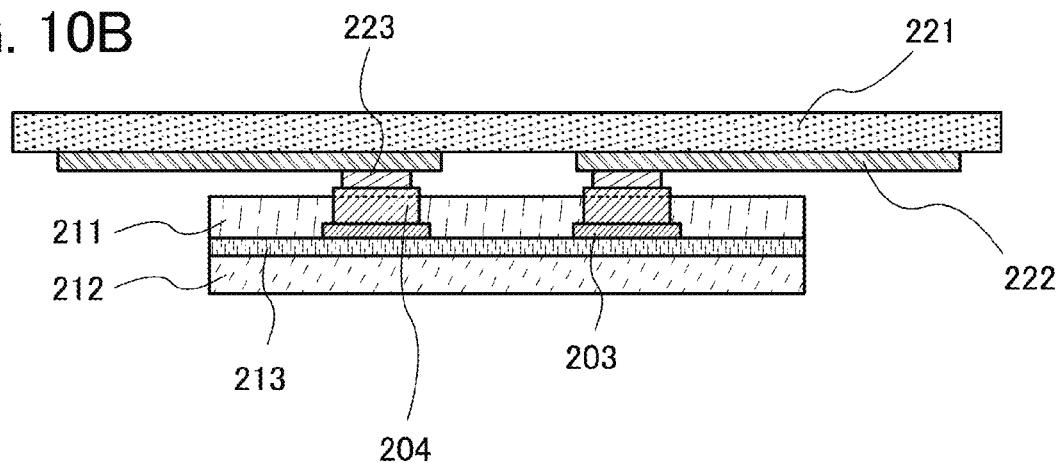

FIG. 10B illustrates an RFID tag in which the chip illustrated in FIG. 10A is connected to an external antenna. An external antenna 222 is formed on a film for an external antenna 221 and electrically connected to the conductive resin 204 through a conductive adhesive 223. The conductive adhesive 223 may be an anisotropic conductive film.

A region 213 in FIG. 10B includes the semiconductor circuit portion 202 and is a region other than the conductive resin 204 and the electrode pad 203 in the chip. The chip is protected by being sandwiched between a front structure body 211 and a rear structure body 212. The front structure body 211 and the rear structure body 212 each have a structure similar to the structure body 120 described in Embodiment 1. That is, the front structure body 211 and the rear structure body 212 each have a structure in which a fibrous body is impregnated with an organic resin.

In a similar manner to that in Embodiment 1, when the conductive resin 204 is provided over the front structure body 211, a portion of the organic resin in the front structure body 211 is dissolved and a metal particle in the conductive resin 204 moves across the fibrous body in the front structure body 211. Accordingly, the conductive resin 204 functions as a through electrode which reaches a surface of the front structure body 211. The conductive resin 204 with which the front structure body 211 is impregnated is connected to the conductive adhesive 223. Thus, the semiconductor circuit portion 202 in the chip is electrically connected to the external antenna 222 through the electrode pad 203, the conductive resin 204, and the conductive adhesive 223.

Figure 10C:
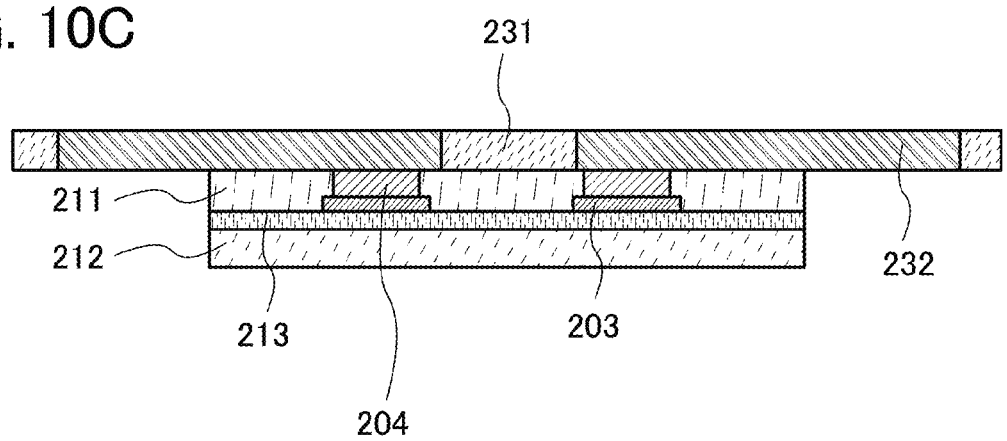

FIG. 10C illustrates an RFID tag having a structure different from that of FIG. 10B.

An external antenna 232 in FIG. 10C is formed in a structure body for an external antenna 231 having a fibrous body and an organic resin in the following manner in accordance with Embodiment 1. First, a conductive resin is provided over the structure body for an external antenna 231 so as to form the shape of the external antenna 232. A portion of the organic resin in the structure body for an external antenna 231 is dissolved and a metal particle in the conductive resin moves across the fibrous body, thereby forming the external antenna 232 in the structure body for an external antenna 231.

In a similar manner to that of FIG. 10B, the chip is protected by being sandwiched between the front structure body 211 and the rear structure body 212. Further, in a similar manner to that of FIG. 10B, the conductive resin 204 functions as a through electrode in the front structure body 211.

The structure body for an external antenna 231 in which the external antenna 232 is formed is attached to the chip which is sandwiched between the front structure body 211 and the rear structure body 212. At this time, the conductive resin 204 is in contact with the external antenna 232; accordingly, the semiconductor circuit portion 202 in the chip is electrically connected to the external antenna 232 through the electrode pad 203 and the conductive resin 204.

Here, a manufacturing method of the RFID tag illustrated in FIG. 10B will be described with reference to FIGS. 11A to 11G.

Figure 11A:
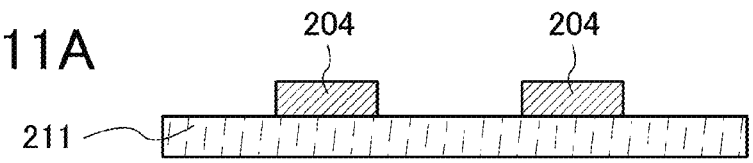
FIGS. 11A to 11G are cross-sectional views illustrating a manufacturing method of an RFID tag.

The conductive resin 204 is provided over the front structure body 211 (see FIG. 11A). In this embodiment, an organic resin including silver (Ag) is printed on the front structure body 211 as the conductive resin 204. Note that the organic resin in the front structure body 211 is not baked and is uncured.

Figure 11B:
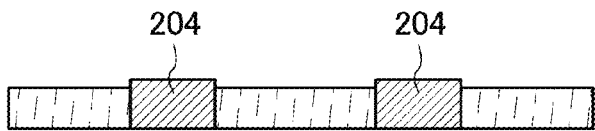

By the organic resin of the conductive resin 204, a portion of the organic resin in the front structure body 211 is dissolved and a silver particle in the conductive resin 204 moves across the fibrous body in the front structure body 211, thereby forming a through electrode (see FIG. 11B).

Here, prebaking may be performed in order to cure the conductive resin 204.

Figure 11C:
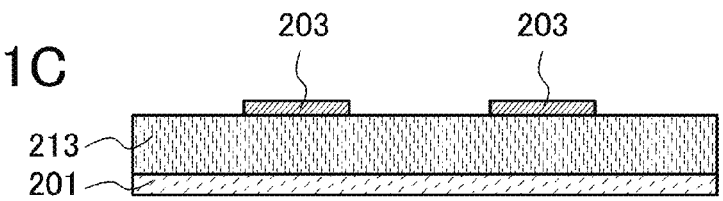
Figure 11D:
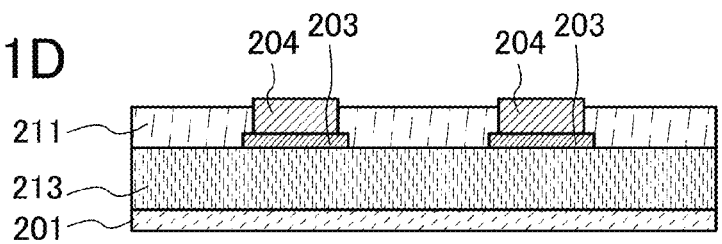

In addition, the chip having the electrode pad 203 and the region 213 in which the semiconductor circuit portion 202 is provided is prepared over the substrate 201 (see FIG. 11C).

The chip is attached to the front structure body 211 impregnated with the conductive resin 204 illustrated in FIG. 11B so that the conductive resin 204 is in contact with the electrode pad 203. Then, hot pressing is performed to firmly fix the front structure body 211 (see FIG. 11D).

Figure 11E:
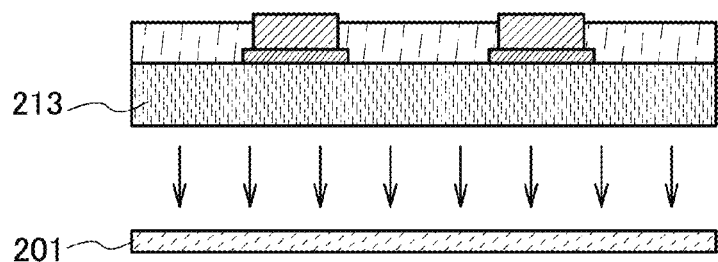

Next, the substrate 201 is separated from the region 213 (see FIG. 11E).

Figure 11F:
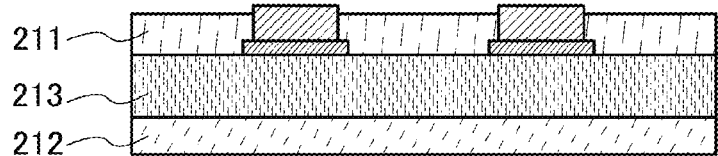
Figure 11G:
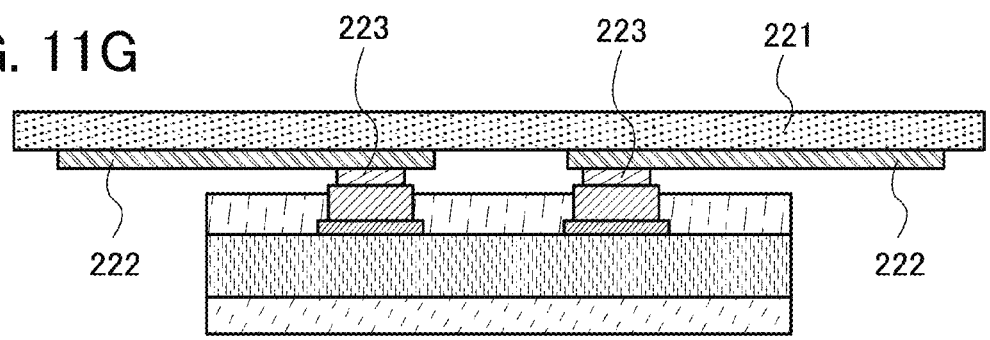

The region 213 from which the substrate 201 is separated is attached to the rear structure body 212, and the rear structure body 212 is firmly fixed by hot pressing (see FIG. 11F).

The film for an external antenna 221 on which the external antenna 222 is formed is attached to the chip which is sandwiched between the front structure body 211 and the rear structure body 212. At this time, the conductive resin 204 is in contact with the external antenna 222; accordingly, the semiconductor circuit portion 202 in the chip is electrically connected to the external antenna 222 through the electrode pad 203 and the conductive resin 204 (see FIG. 11G).

Example 1

In Example 1, a prepreg in which electrical conduction is realized using silver paste without a through-hole provided will be described.

The silver paste used in this example includes silver powder, 2-(2-butoxyethoxy)ethyl acetate, and an epoxy resin. As the prepreg, a prepreg produced by Asahi-Schwebel Co., Ltd. is used. The prepreg includes a brominated epoxy resin and a sheet-like fibrous body including a glass fiber. The sheet-like fibrous body is woven using fifty glass fibers each having a diameter of 4 μm as one bundle.

Figure 7A:
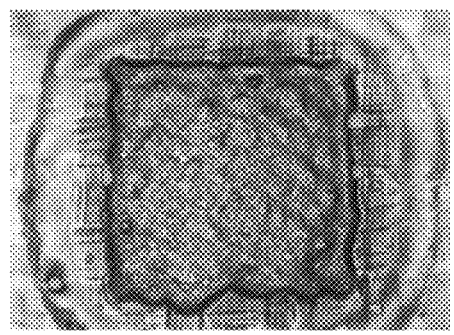
FIGS. 7A and 7B are optical micrographs of a conductive resin and a structure body.
Figure 7B:
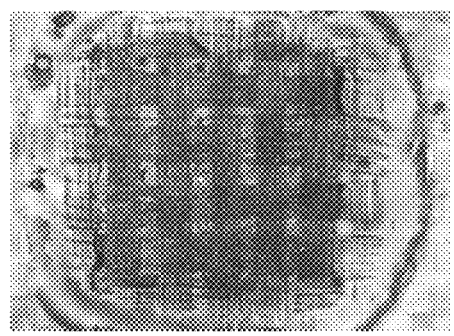

The silver paste is screen-printed on the prepreg and then pressed at 195° C. for 60 minutes. FIGS. 7A and 7B are optical micrographs after the pressing and FIG. 8 is a schematic view at that time. FIG. 7A shows the front surface of the prepreg on which the silver paste is screen-printed, and FIG. 7B shows the rear surface thereof. FIG. 8 is a schematic view showing the cross section of the prepreg, which is the structure body 120. The structure body 120 includes the sheet-like fibrous body 113 formed using a glass fiber and the organic resin 114 including a brominated epoxy resin. Further, silver paste as the conductive resin 101 is provided in the structure body 120. FIG. 7A is an optical micrograph in a region surrounded by dotted lines A in FIG. 8. FIG. 7B is an optical micrograph in a region surrounded by dotted lines B in FIG. 8.

In particular, as shown in FIG. 7B, a portion of the resin in the prepreg is dissolved to expose the glass fiber. Thus, silver passes through the glass fiber and reaches the rear side of the prepreg, whereby electrical conduction is realized in the prepreg.

This application is based on Japanese Patent Application serial no. 2008-161497 filed with Japan Patent Office on Jun. 20, 2008, the entire contents of which are hereby incorporated by reference.

What is claimed is:

1. A manufacturing method of a wiring substrate, comprising the steps of:
   providing a structure body comprising a fibrous body embedded in an organic resin, wherein the structure body has a first surface and a second surface opposite to each other;
   forming a resin including metal particles on the first surface; and
   dispersing the metal particles from the first surface into the structure body to form a terminal between the first surface and the second surface,
   wherein the fibrous body passes through the terminal.

2. The manufacturing method of a wiring substrate according to claim 1,
   wherein the metal particles include at least one element selected from the group consisting of copper, silver, nickel, gold, platinum, palladium, tantalum, molybdenum, titanium, and tin.

3. The manufacturing method of a wiring substrate according to claim 1, wherein the fibrous body comprises glass fiber.

4. The manufacturing method of a wiring substrate according to claim 3,
   wherein the metal particles include at least one element selected from the group consisting of copper, silver, nickel, gold, platinum, palladium, tantalum, molybdenum, titanium, and tin.

5. The manufacturing method of a wiring substrate according to claim 1, wherein in forming the resin including metal particles, the resin is spaced from the fibrous body by the organic resin.

6. A manufacturing method of a semiconductor device, comprising the steps of:
   forming an integrated circuit chip;
   forming a wiring over the integrated circuit chip, the wiring being electrically connected to the integrated circuit chip;
   covering the wiring by a structure body comprising a fibrous body embedded in an organic resin;

forming a resin including metal particles over the structure body so that the resin is spaced from the wiring by the structure body; and dispersing the metal particles into the structure body to form a terminal which is in direct contact with the wiring.

7. The manufacturing method of a semiconductor device according to claim 6, wherein the metal particles include at least one element selected from the group consisting of copper, silver, nickel, gold, platinum, palladium, tantalum, molybdenum, titanium, and tin.

8. The manufacturing method of a semiconductor device according to claim 6, wherein the fibrous body comprises glass fiber.

9. The manufacturing method of a semiconductor device according to claim 8, wherein the metal particles include at least one element selected from the group consisting of copper, silver, nickel, gold, platinum, palladium, tantalum, molybdenum, titanium, and tin.

10. A manufacturing method of a semiconductor device, comprising the steps of:

forming an element layer comprising a thin film transistor;

forming a wiring over the element layer, the wiring being electrically connected to the thin film transistor;

covering the wiring by a structure body, the structure body comprising a fibrous body embedded in an organic resin;

forming a resin including metal particles over the structure body so that the resin is spaced from the wiring by the structure body; and dispersing the metal particles into the structure body to form a terminal which is in direct contact with the wiring.

11. The manufacturing method of a semiconductor device according to claim 10, wherein the metal particles include at least one element selected from the group consisting of copper, silver, nickel, gold, platinum, palladium, tantalum, molybdenum, titanium, and tin.

12. The manufacturing method of a semiconductor device according to claim 10, wherein the fibrous body comprises glass fiber.

13. The manufacturing method of a semiconductor device according to claim 12, wherein the metal particles include at least one element selected from the group consisting of copper, silver, nickel, gold, platinum, palladium, tantalum, molybdenum, titanium, and tin.

* * * * *

UNITED STATES PATENT AND TRADEMARK OFFICE
CERTIFICATE OF CORRECTION

| | | |
|---|---|---|
| PATENT NO. | : 8,555,497 B2 | Page 1 of 1 |
| APPLICATION NO. | : 12/485957 | |
| DATED | : October 15, 2013 | |
| INVENTOR(S) | : Hatano et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 624 days.

Signed and Sealed this
Thirty-first Day of March, 2015

Michelle K. Lee
*Director of the United States Patent and Trademark Office*